United States Patent [19]
Hall

[11] Patent Number: 5,551,821
[45] Date of Patent: Sep. 3, 1996

[54] WORKTABLE LOADING AND UNLOADING APPARATUS AND METHOD

[75] Inventor: Hendley W. Hall, San Pedro, Calif.

[73] Assignee: Excellon Automation Co., Torrance, Calif.

[21] Appl. No.: 439,658

[22] Filed: May 8, 1995

[51] Int. Cl.⁶ .................................................... B65G 47/00
[52] U.S. Cl. ...................... 414/18; 198/346.2; 198/740; 198/747; 242/917; 254/266; 414/280; 414/331; 414/750
[58] Field of Search ................................ 414/222, 225, 414/280, 661, 749, 14, 18, 19; 198/346.2, 740, 747; 242/917, 390.2, 390.3; 254/264, 266

[56] References Cited

U.S. PATENT DOCUMENTS

| | | | |
|---|---|---|---|
| 3,308,977 | 3/1967 | Cochran et al. | 414/222 |
| 3,371,453 | 3/1968 | Groskopfs et al. | 242/390.3 X |
| 3,371,801 | 3/1968 | Widegren | 242/390.2 X |
| 3,589,632 | 6/1971 | Rew | 242/390.3 X |
| 3,810,730 | 5/1974 | Carlsson | 414/280 X |
| 3,862,528 | 1/1975 | Meissinger | 242/390.2 X |
| 4,019,411 | 4/1977 | Bohn et al. | 414/14 X |
| 4,049,134 | 9/1977 | Dolgen | 414/222 X |
| 4,378,189 | 3/1983 | Takeshita et al. | 414/225 |
| 4,589,540 | 5/1986 | Kampf | 198/346.2 |
| 4,609,320 | 9/1986 | Rubin | 414/225 |

*Primary Examiner*—David A. Bucci
*Attorney, Agent, or Firm*—G. Donald Weber, Jr.

[57] ABSTRACT

An apparatus for loading and unloading components such as circuit boards from a transport unit to a work station. The apparatus includes a flexible tape which is wound on a storage drum and selectively extended or retracted relative to the drum. Components are included to drive the drum, elevate the extended tape, sense the position of the tape and the like.

16 Claims, 2 Drawing Sheets

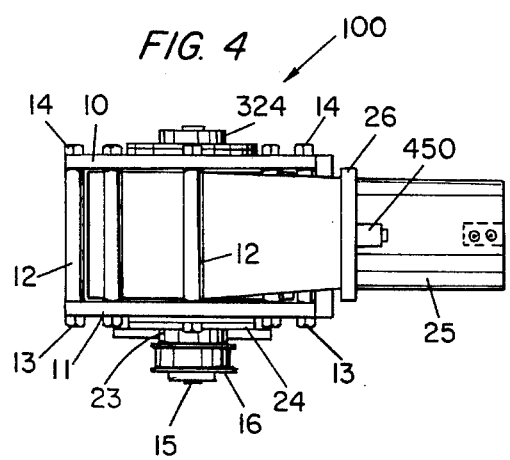
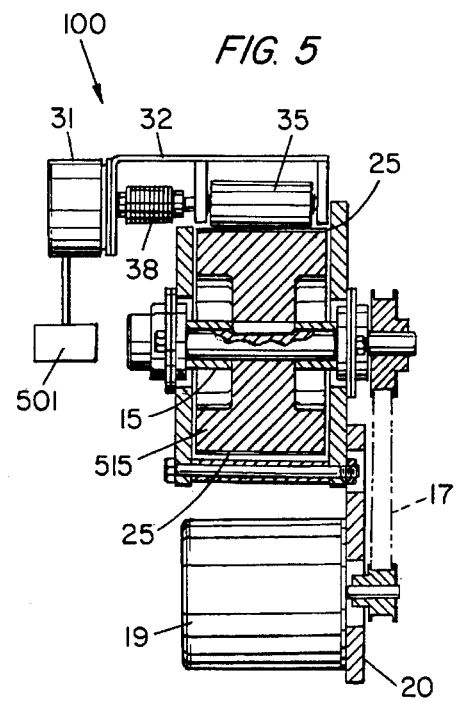
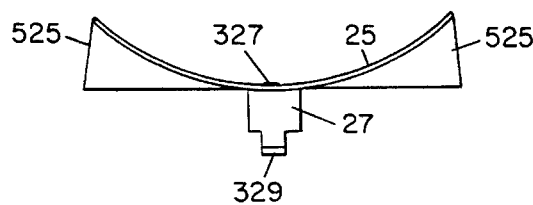
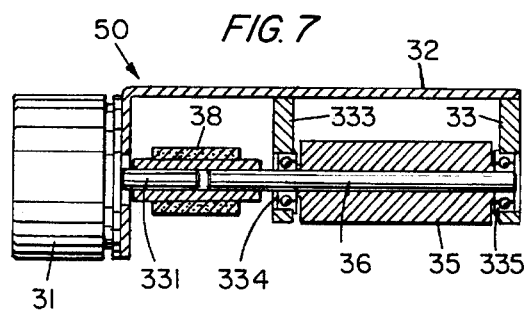
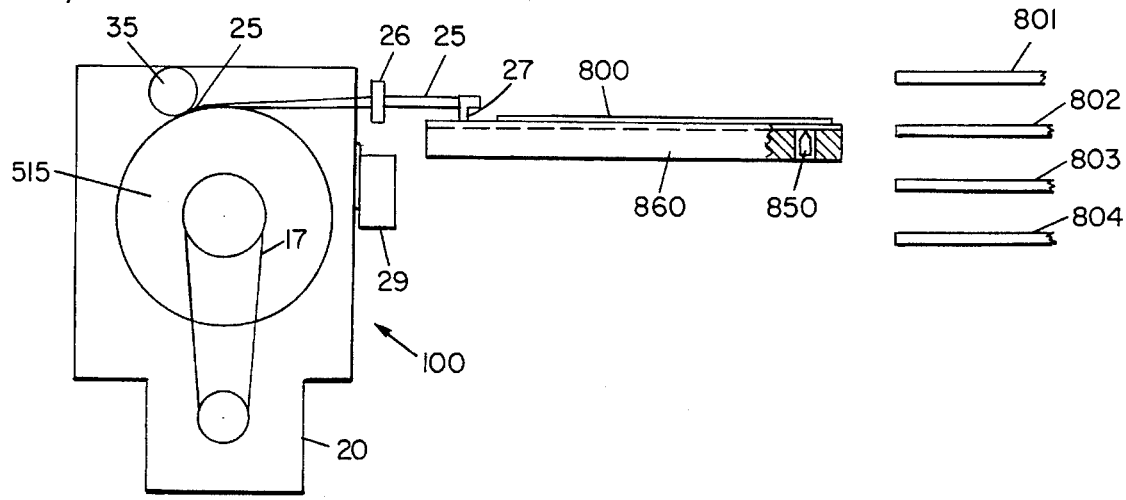

WORKTABLE LOADING AND UNLOADING APPARATUS AND METHOD

BACKGROUND

1. Field of the Invention

This invention relates, in general, to apparatus and methods for handling workpieces and, in particular, to apparatus for transferring workpieces to and from a workstation. The invention relates especially to apparatus an methods for automatically loading and unloading printed circuit board panels onto and off of the tooling plate of a computer controlled drilling machine.

2. Prior Art

The drilling operations performed in conjunction with manufacturing printed circuit board panels are required to be performed to very precise tolerances. These drilling operations are performed with a computer controlled drilling machine under automatic numerical control and may typically involve thousands of drilling operations per panel. In a typical application, the printed circuit board panels are placed on a horizontal work platform or tooling plate located below the drill spindle. The panels are typically stacked up to three or four high on the tooling plate of the drilling machine so that several panels are drilled at the same time. Inasmuch as the spindle must be able to reach any point on the panels, relative movement in three dimensions is required between the spindle and the panels. This requirement has been implemented in various ways.

In a common drilling machine design, the machine table moves in one horizontal dimension and the drill spindle moves in the orthogonal horizontal dimension. In addition, the drill spindle moves in the vertical dimension. In other designs, for example, the tooling plate may be configured to move in both horizontal dimensions or even vertically or the drill spindle may move in additional dimensions.

Recent trends and increased competition in manufacturing circuit panels have created a need for increased efficiency and cost reduction in the manufacturing process. The batch sizes have been getting smaller and are predicted to get still smaller in the future. However, a manufacturer is required to be flexible enough to handle these small batch sizes. Although the drilling process is already highly automated, increased automation of the process may further reduce the need for operator action or intervention.

For many years the panels have been hand loaded (and hand unloaded) onto the tooling plate of the drilling machine. This hand loading of the panels onto the tooling plate requires time consuming and expensive operator intervention. One method of increasing the efficiency and reducing the cost of the drilling process is to reduce the time and operator demands of the loading and unloading process. In a typical manufacturing operation, multiple drilling machines are operated simultaneously. Thus, a reduction in the operator work load will allow fewer operators to operate more drilling machines.

SUMMARY OF THE INVENTION

A loading/unloading apparatus which includes a flexible tape wound on a drum. The drum is selectively activated to rotate and, thus, extend or retract the tape. By properly configuring the tape, it retains a relatively rigid characteristic. The movement of the tape can be monitored by a suitable encoder. By using the apparatus with computer controls, an automatic load/unload system can be achieved.

Other advantages, and features of the present invention will become apparent from the following detailed description of the preferred embodiment of the invention when considered in conjunction with the accompanying drawings, wherein like reference characters represent like components throughout the several views therein.

BRIEF DESCRIPTION OF THE DRAWINGS

FIG. 4 is a top plan view of the apparatus of the invention.

FIG. 5 is a sectional view of the apparatus of the instant invention taken along the lines 5—5 of FIG. 2.

FIG. 6 is an end view of the retractor tape of the instant invention.

FIG. 7 is a partial cross-sectional view of the encoder assembly.

FIG. 8 is a schematic representation of the apparatus of the instant invention, storage cart and tooling plate.

DESCRIPTION OF THE PREFERRED EMBODIMENT

Figure 1:
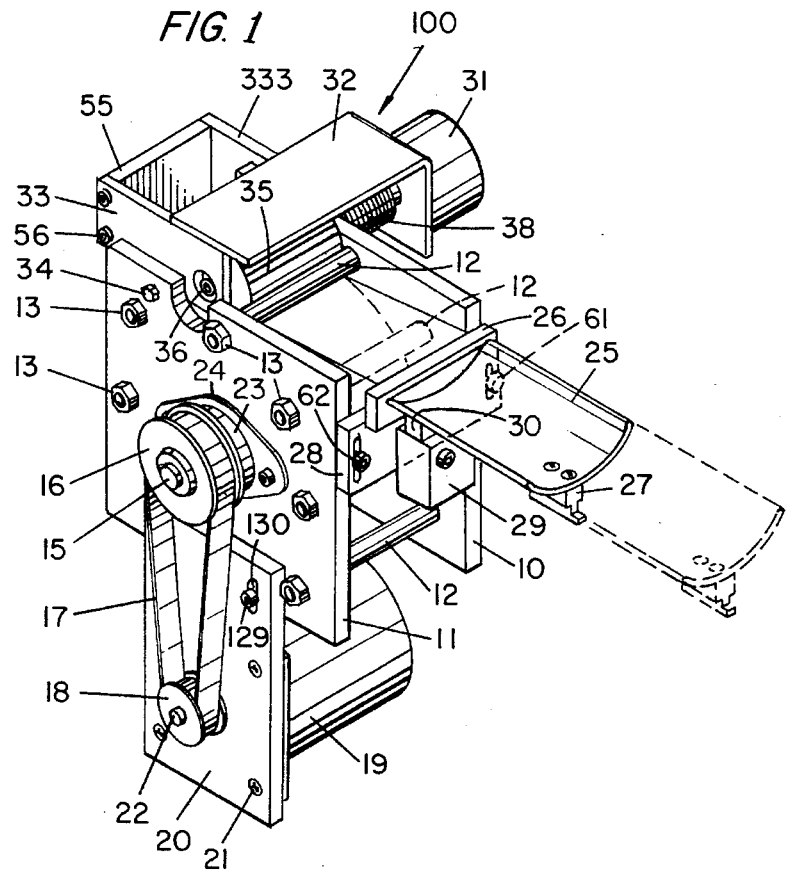
FIG. 1 is a perspective view of the loading and unloading apparatus of the present invention.

Referring now to FIG. 1, there is shown a front perspective view of the apparatus 100 which forms the loading and unloading apparatus of the instant invention. The apparatus 100 includes housing sides 10 and 11 which are, typically, plates of sheet aluminum, steel or the like and which are mounted parallel to each other.

Typically, the plates are mounted to each other but spaced apart by spacers 12, a plurality of which are shown. Spacers 12, typically, are formed of nylon tubes or the like which are mounted on bolts which pass through the plates 10 and 11. The bolts, and, thus, the tubes 12 are mounted in place by the nuts 13.

In this embodiment, there are eight (8) spacers comprising the nuts 13, bolts 14 (see FIG. 2) and tubes 12. These spacers are arranged to be equidistant from the shaft 15 which passes through the plates 10 and 11.

A suitable bearing 23 is used to mount the shaft 15. A flange 24 is utilized to mount the bearing 23 and the shaft 15 to the housing side 11. The shaft 15 passes through a drum (see infra) and is mounted on a suitable flange and bearing on the reverse side of housing side 10.

A suitable sheave 16 is mounted on shaft 15. The sheave 16 is adapted to receive the drive belt 17 which also engages the drive pulley 18 which is driven by the stepper motor 19. In this embodiment, motor 19 is mounted on motor mount 20 by means of appropriate fasteners such as nuts and bolts 21 or the like. Motor mount 20 is adjustably mounted on plate 11 by a suitable bolt 129 which passes through an adjustment groove 130 in motor mount 20. The shaft 22 of motor 19 passes through motor mount 20 and is engaged by the drive pulley 18.

A drum (see FIG. 5) rotates on shaft 15 and supports the flexible tape 25 which is wound thereon. As will become apparent, as the motor 19 drives the pulley 18 and shaft 15, the drum is caused to rotate thereby to move the tape 25 inwardly or outwardly relative to the apparatus 100.

The tape 25 passes through a tape guide 26 which, in the preferred embodiment, has an arcuate slot therethrough in order to allow the tape 25 to assume a curved configuration. As will be described, this curved configuration establishes a structural strength in the otherwise relatively limp steel tape so that the tape is able to remain extended over a reasonable distance while not otherwise supported.

A tip or foot 27 is affixed to the end of the tape 25 by any suitable means such as screws, rivets or the like. The foot 27 is used to engage an object to be moved by the system 100.

A mounting block 28 is adjustably mounted to the front edges of the housing side 10 and 11 by means of appropriate screws 61. The screws 61 are passed through slots 62 in the mounting block 28 and affixed into the mounting side.

A solenoid 29 is mounted onto mounting block 28 by any suitable means. The solenoid 29 includes an armature 30 which is selectively moved up and down by operation of the solenoid. It should be understood that the solenoid can be an electromagnetic solenoid or a pneumatically operated cylinder and piston, if so desired.

The armature 30 engages (or can be joined to) the lower 0 surface of tape guide 26. Thus, when the solenoid 29 is activated, the tape guide 26 is raised, thereby raising the extended, curved portion of tape 25. When the solenoid 29 is deactivated, the armature is lowered whereby the tape guide 26 and the tape 25 are lowered.

An encoder mechanism 31 of conventional design is supported by encoder bracket 32. The bracket 32 is mounted to a pair of bearing plates 33 and 333. Plate 33 is mounted to housing side 11 by a bolt or screw 34. Bearing plate 333 is mounted to housing side 10 by a similar bolt or screw. A tie plate 55 is joined to the bearing plates 33 and 333 by screws 56 for support and spacing thereof.

The encoder 31 is connected to a sensing wheel 35 which is mounted on the shaft 36. The shaft 36 is mounted in suitable bushings in bearing plates 33 and 333 to permit ready rotation of the sensing wheel when driven by the drum 515 (see infra) or the tape 25 which is coiled on the drum.

The shaft 36 of the sensing wheel is connected to the shaft of encoder 31 by a suitable coupling 38 which is, preferably, a somewhat flexible coupling. This type of coupling avoids the necessity of extreme precision in the alignment of the shafts of encoder 31 and the sensing wheel 35.

Figure 2:
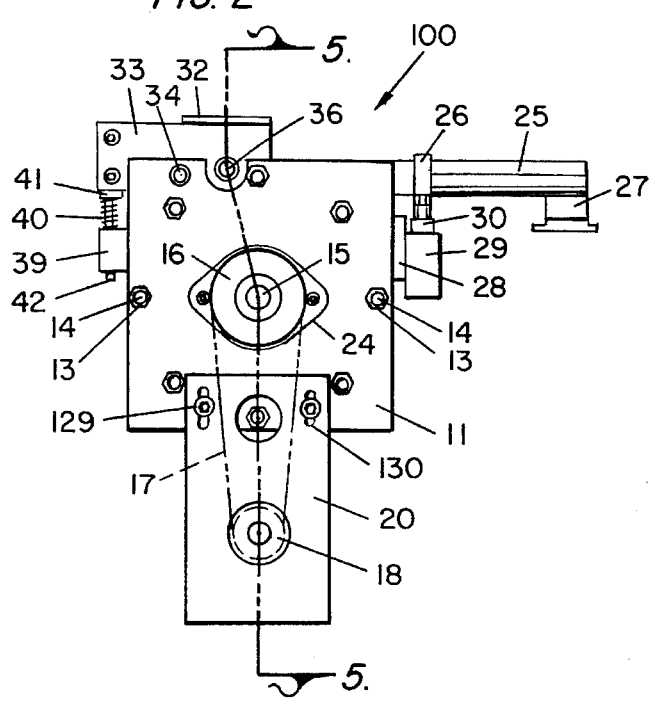
FIG. 2 is a side elevation view of the apparatus of the invention.

Referring now to FIG. 2, there is shown a side elevation view of the apparatus 100. The motor mount 20 is adjustably mounted to housing side 11 by the bolts 129 which pass through slots 130 in the motor mount 20. The drive pulley 18 and the drive belt 17 are shown connected to the sheave 16 which is mounted on shaft 15 and supported by flange 24.

The nut and bolt combinations 13 and 14 are shown spaced around the housing side 11 and substantially define the circumference of the drum which supports the tape 25. In essence, the spacers operate as retainers to keep the tape on the drum.

The mounting block 28 is mounted to the front edge of housing side 11, as described supra. The solenoid 29 is mounted to the mounting block 28. The armature 30 extends upwardly from solenoid 29 and engages the bottom surface of tape guide 26, as noted above. The solenoid 28 and armature 29 are effective to lift the tape guide 26 and, thus, the curved tape 25 when the solenoid is activated. The foot or hook 27 is attached to the end of tape 25.

The encoder support 32 is mounted to bearing plate 33 which is mounted the housing side 11 by means of bolts 34. In addition, the bearing plate 33 is mounted to a tie plate 41 in which is mounted a rod 42. The rod 42 extends vertically from plate 41 and extends through the spring bar 39. A compression spring 40 is placed around the rod 42 between the tie plate 41 and the bar 39 to selectively compensate for the change of drum diameter as the tape unwinds from the drum as the tape extends.

Figure 3:
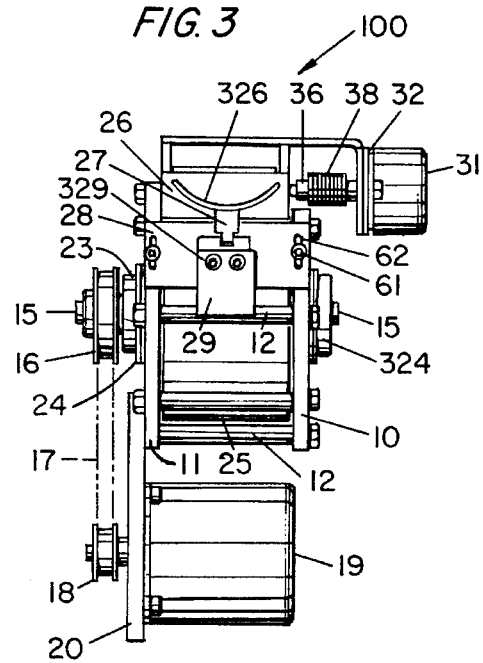
FIG. 3 is a front elevation view of the apparatus of the invention.

Referring now to FIG. 3, there is shown a front elevation view of the apparatus 100. The drive motor 19 is mounted on the motor mount 20. The drive belt 17 is connected between the drive pulley 18 and the sheave 16. The shaft 15 is driven by sheave 16. The flange 24 mounts the sheave, bearing, shaft and related mechanism properly. A flange and bearing 324 is mounted on the other side of the apparatus at housing side 10 to support the other end of shaft 15.

Spacers 12 are shown disposed between the two side plates. The encoder 31 is mounted in the mounting bracket 32 and is connected by coupling 38 to the shaft 36 of the encoder wheel. The mounting block 28 is adjustably mounted to the side walls 10 and 11 by screws 61 in slots 62. The solenoid 29 is mounted to the mounting block 28 by appropriate screws 329. The armature 30 is engaged with the tape guide 26 which includes the arcuate groove 326 for supporting the shape of the tape 25. The hook 27 is shown depending from tape 25.

Referring now to FIG. 4, there is shown a top plan view of the system 100 with the encoder mechanism removed for convenience. The side walls 10 and 11 are spaced apart by the spacers 12 which are held in place by the nuts 13 and bolts 14. The placement of the flanges 24 and 324 is shown relative to the sheave 16 and shaft 15. The guide block 26 is shown engaging the tape 25.

In FIG. 4, a limit stop 450 is shown attached to the guide block 26. Typically, limit stop 450 is a microswitch although alternative arrangements can be made. The limit switch 450 can be omitted, if desired. However, in a preferred embodiment, it is desirable to have the limit switch 450 which can detect the end of the tape 25. Thus, the tape 25 cannot be totally withdrawn onto the drum (to be described) through the tape guide 26.

Referring now to FIG. 5, there is shown a partial cross-sectional view of the apparatus 100 viewed from the rear. In FIG. 5, the drum 515 is shown to have a T-shaped radial configuration in cross-section. The drum 515 is fixedly mounted to shaft 15 which is also shown partially in cross-section. It is clear that motor 19 drives shaft 15 via the appropriate pulleys, sheaves and drive belt 17. The shaft 15 and, thus, the drum 515 are caused to rotate about this central axis. A layer of tape 25 is depicted at the circumference of drum 515 to indicate that the tape 25 is coiled on the circumference or perimeter of the drum 515.

The encoder sensing wheel 35 is shown to be in rolling contact with and driven by the tape 25 as it passes by the sensing wheel 35. As the sensing wheel 35 is caused to rotate around its axis by the tape 25 which is driven by drum 515, the sensing wheel causes coupler 38 to impart rotational movement to the encoder 31. Typically, encoder 31 is a conventional encoder of the type such as is manufactured by Dynamics Research Corporation and is referred to as an incremental optical modular rotary encoder. Of course, other types of such encoders can be obtained or utilized.

In a preferred embodiment, the encoder 31 is connected to a computer or other control system 501 (shown schematically) to measure the movement of the tape in both the loading and unloading operations. That is, as the tape 25 is moved inwardly or outwardly relative to the apparatus 100, the sensing wheel 35 is rotated. As a consequence the encoder 31 is driven and produces signals which are supplied to computer 501 to calculate the movement of the tape. Thus, the extent of the tape outwardly from the system can be controlled. Likewise, the tape can be returned to specified positions as defined by the computer 501.

Referring now to FIG. 6, there is an end view of the tape 25. In particular, an illustration of the curved configuration of the tape 25 at the outward end thereof is provided. The tape 25 is, typically, relatively flat on the inward side of the tape guide 26. Consequently, the flat configuration and the transitional edges 525 of the tape 25 are suggested.

The foot 27 (or hook) is shown depending from the tape 25. The foot is, typically, mounted to the tape 25 by appropriate means such as screws or rivets 327. The foot 27 includes a lower portion 329 which is adapted to engage with the object to be moved by the tape such as, but not limited to, printed circuit boards in the functional operation of the system.

Referring now to FIG. 7, there is shown a cross-sectional view of the encoder apparatus 50. The computer is omitted for convenience. The apparatus 50 includes the encoder 31 which is mounted to bracket 32. The bracket 32 is mounted to the side supports 33 and 333 of the encoder mechanism. The sensing wheel 35 is mounted on the shaft 36 which passes through bushings 335 and 334. The shaft 331 extends outwardly from encoder 31 and passes through an appropriate opening in the encoder mount 32. The shafts 331 and 36 are joined together by the flexible coupling 38. As noted, the coupling 38 can be a hard rubber, bellows-type coupling which permits a certain alignment tolerance between the two shafts and assists in ease of assembly of the apparatus.

Referring now to FIG. 8, there is shown a schematic representation of the invention in an operational environment. The apparatus 100 includes the appropriate side walls and mounting brackets with the appropriate sheaves and pulleys described supra joined. The drive belt 17 is provided to drive the drum 515. The encoder sensing wheel 35 is shown tangentially abutting the circumference of drum 515 and/or tape 25 which is mounted on the surface of drum 515. The tape 25 extends outwardly through the tape guide 26 which is selectively moved up or down by the solenoid 29 as described supra. The foot 27 of the tape 26 is adapted to selectively engage a work unit 800 which, in this case, is a printed circuit board or the like. In the illustration shown in FIG. 8, the work unit is disposed on tooling plate 860. As tape 25 is driven outwardly by the rotation of drum 515 (clockwise in this illustration), the printed circuit board 800 is selectively pushed or placed on one of the shelves 801–804 which schematically represent a storage compartment, transporting conveyor or cart or the like. Conversely, in order to move the workpiece from one of the shelves 801–804 onto tooling plate 860, the tape 25 is lifted by tape guide 26 (and solenoid 29) and driven outwardly to extend beyond the work unit 800 as it rests on a shelf. The tape is then lowered by tape guide 26 (and solenoid 29) whereupon foot 27 engages the far side of the work unit. The drum 515 is then driven in the counterclockwise direction (in this illustration) until the work unit resides on the tooling plate 860. The push/pull process continues as desired. To insure proper positioning, the foot 27 can extend into the slot or channel 861 (shown in dashed outline) which can be formed in the tooling plate 860.

In the embodiment shown in FIG. 8, a sensor 850 is schematically shown disposed in the tooling plate 860. The sensor 850 in the table can be of any number of different types. It can be a proximity, optical, air jet, or a mechanical limit switch. It can be any technology that can sense an edge, in this case, an edge of the work unit 800. Typically, the sensor 850 is connected to the computer 507 (see FIG. 5) by any suitable means (not shown).

On loading the workpiece 800 (or circuit board) onto the tooling plate 860, the sensor 850 will detect the leading edge of the board when it reaches the sensor. The location of the sensor 850 in relation to the pin locator in the system is stored in the computer 501 along with data about the work unit. The computer 501 will calculate the distance to move the workpiece to properly position the workpiece on the tooling plate.

Conversely, on unloading, i.e. removing the board from the tooling plate, the sensor 850 will detect the trailing edge of the board and determine how far to move the board to get it properly onto the cart, the conveyor, or whatever apparatus is to receive the work unit. This permits entirely automatic operation without the need for manual control.

Thus, there is shown and described a unique design and concept of an apparatus for transferring workpieces to and from a workstation. The particular configuration shown and described herein relates the apparatus and method for automatically loading and unloading printed circuit board panels from a computer controlled drilling machine. While this description is directed to a particular embodiment, it is understood that those skilled in the art may conceive modifications and/or variations to the specific embodiments shown and described herein. Any such modifications or variations which fall within the purview of this description are intended to be included therein as well. It is understood that the description herein is intended to be illustrative only and is not intended to be limited by the claims appended hereto.

I claim:

1. A material handling assembly comprising:

a flexible tape, drum means for storing said tape, drive means for driving said drum means to selectively extend and retract said tape relative to said drum means, said drive means comprises a prime mover, tape guide means for receiving said flexible tape and urging said flexible tape into a predetermined configuration to impart rigidity to said flexible tape when said flexible tape assumes said predetermined configuration, positioning means engaged with said tape guide means for controlling the vertical position of said tape relative to said drum means, and encoder means driven by said flexible tape for determining the position to which said flexible tape has been driven by said drive means relative to said drum means.

2. The assembly recited in claim 1 including, hook means attached to an end of said flexible tape.

3. The assembly recited in claim 1 wherein, said drum means includes, a housing, and a cylinder rotatably mounted on a shaft supported in said housing.

4. The assembly recited in claim 3 including, a plurality of spacers mounted in said housing adjacent to said cylinder and operative to retain said flexible tape in a coiled relation on said cylinder.

5. The assembly recited in claim 4 wherein, said spacers are all spaced equidistant from said cylinder.

6. The apparatus recited in claim 1 wherein,
said flexible tape is fabricated of a thin steel ribbon.

7. The assembly recited in claim 1 wherein,
said flexible tape has a curved configuration transverse to the longitudinal axis thereof to provide the tape with rigidity along said longitudinal axis.

8. The assembly recited in claim 1 wherein,
said positioning means comprises a solenoid.

9. The assembly recited in claim 1 wherein,
said encoder means includes roller means arranged in rolling contact with said flexible tape.

10. The assembly recited in claim 1 wherein,
said encoder means includes computer means for storing the position of said flexible tape therein as a reference for moving said flexible tape to a predetermined position.

11. A system for loading and unloading workpieces onto a work station comprising:

a work station;

a workpiece holder disposed on a first side of said work station;

a loader assembly disposed on a second side of said work station opposite said workpiece holder;

a substantially cylindrical support means rotatably mounted on said loader assembly;

a flexible push-pull shaft stored in said support means;

means for rotating said support means for extending and retracting said push-pull shaft across said work station;

tape guide means for receiving said flexible tape and urging said flexible tape into a predetermined configuration to impart rigidity to said flexible tape when said flexible tape assumes said predetermined configuration, encoder means driven by said flexible tape for determining the position to which said flexible tape has been driven by said drive means relative to said drum means, and means attached to said push-pull shaft for engaging workpieces whereby said workpieces can be moved between said work station and said workpiece holder.

12. The system recited in claim 11 including,
channel means in said work station for guiding said push-pull shaft.

13. The system recited in claim 11 including,
means for controlling the vertical position of said tape guide means thereby to control the position of said push-pull shaft.

14. The system recited in claim 11 including,
sensor means for determining the position of said workpiece relative to said work station.

15. The system recited in claim 14 wherein,
said sensor means is mounted on said work station.

16. The systems recited in claim 14, wherein,
said sensor means comprises an optical switch.

\* \* \* \* \*